(12) United States Patent
Lu et al.

(10) Patent No.: US 6,822,258 B2
(45) Date of Patent: Nov. 23, 2004

(54) SELF-ORGANIZED NANOMETER INTERFACE STRUCTURE AND ITS APPLICATIONS IN ELECTRONIC AND OPTO-ELECTRONIC DEVICES

(75) Inventors: Jong-Hong Lu, Taipei (TW); Huai-Luh Chang, Taipei (TW); Chiung-Hsiung Chen, Hsinchu (TW); Yi-Ping Huang, Ilan (TW); Sheng-Ju Liao, Hsinchu (TW); Yuh-Fwu Chou, Hsinchu (TW); Ho-Yin Pun, Hsinchu (TW)

(73) Assignee: Industrial Technology Research Institute/Material Research, Hsinchu (TW)

( * ) Notice: Subject to any disclaimer, the term of this patent is extended or adjusted under 35 U.S.C. 154(b) by 22 days.

(21) Appl. No.: 10/377,693

(22) Filed: Mar. 4, 2003

(65) Prior Publication Data

US 2004/0119062 A1 Jun. 24, 2004

(30) Foreign Application Priority Data

Dec. 20, 2002 (TW) ........................................ 91136853 A

(51) Int. Cl.$^7$ .............................................. H01L 29/12
(52) U.S. Cl. ............................ 257/43; 257/46; 257/81; 257/99; 257/101; 257/103
(58) Field of Search ............................... 257/43, 44–46, 257/81, 99, 101, 103, 104, 750, 762, 765, 771

(56) References Cited

U.S. PATENT DOCUMENTS

| 4,830,890 | A | * | 5/1989 | Kanai ..................... 427/255.39 |
| 5,244,698 | A | * | 9/1993 | Ishihara et al. ............. 427/563 |
| 5,936,257 | A | * | 8/1999 | Kusunoki et al. ............ 257/10 |
| 6,486,391 | B2 | * | 11/2002 | Karg .......................... 136/252 |

* cited by examiner

*Primary Examiner*—Nathan J. Flynn
*Assistant Examiner*—Remmon R. Fordé
(74) *Attorney, Agent, or Firm*—Birch, Stewart, Kolasch & Birch, LLP

(57) ABSTRACT

A self-organized nanometer interface structure is disclosed. During the reactive sputtering process, the chemical dynamics difference among reactants induces self-organization to form a special nanometer interface structure. The nanometer interface structure naturally form an interface potential difference so that it has a rectifying effect in a particular range of potential variation range. Therefore, it functions like a diode. Such a self-organized nanometer interface structure can be used in the manufacturing of diodes, transistors, light-emitting devices, and sonic devices. The invention has the advantages of a wide variety of material selections, highly compatible processes, easy operations, and low-cost fabrications.

9 Claims, 6 Drawing Sheets

SELF-ORGANIZED NANOMETER INTERFACE STRUCTURE AND ITS APPLICATIONS IN ELECTRONIC AND OPTO-ELECTRONIC DEVICES

This nonprovisional application claims priority under 35 U.S.C. § 119(a) on Patent Application No. 091136853 filed in TAIWAN, R.O.C. on Dec. 20, 2002, which is herein incorporated by reference.

BACKGROUND OF THE INVENTION

FIELD OF INVENTION

The invention relates to a nanometer interface structure for the fabrications of diodes, transistors, light-emitting devices, and sonic devices.

RELATED ART

Currently, the methods of manufacturing diodes by doping III-V elements include diffusion and ion implantation. The former requires a reaction temperature of 900~1200° C., while the latter needs an expensive manufacturing apparatus. In addition, the manufacturing is based upon single crystal substrates, on which carrier types and concentration variations and adjustment are performed. The control is non-trivial. Moreover, the costs of the single crystal substrates and equipment are too expensive. The materials are also limited to the III-V family and the compatibility of the manufacturing process is very poor. Therefore, it is imperative to find better diode manufacturing processes, materials, and structures.

SUMMARY OF THE INVENTION

To solve the problems existing in the prior art, the invention provides a self-organized nanometer interface structure. Metal atoms, oxygen atoms, nitrogen atoms, and carbon atoms self-organize into interface structures of metals, metal oxides, metal nitrides, and metal carbonates. Such interface structures are used as the main junction structure in electronic elements, as in diodes, transistors, light-emitting devices, and sonic devices. The self-organized interface structure includes at least an electrode layer, an interface layer, and an extensive layer. The electrode layer is the part that connects the main junction and the electrode. It is mainly made of metals or metal alloys. The interface layer is the polarity change layer of the semiconductor material or the storage tunneling layer of carriers. It is mainly made of metal oxides, metal nitrides, metal carbonates and their combinations. The interface layer has an obvious bell-shape distribution of oxygen, nitrogen, or carbon atoms and an obvious gradient concentration variation of oxygen, nitrogen, or carbon atoms. The extensive layer is used for connections in periodic structures or another end electrode. It is mainly made of metal oxides, metal nitrides, metal carbonates and their combinations. The manufacturing process only requires a usual sputtering apparatus to effectively control the gas ratio in the sputtering chamber. The chemical dynamics difference of reactive sputtering induces self organization to form a special nanometer interface structure.

The invention achieves the following goals: no expensive single crystal substrate is required; there is a wide variety of material selections; the manufacturing process is more compatible; the control is easy; and the cost is lower.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
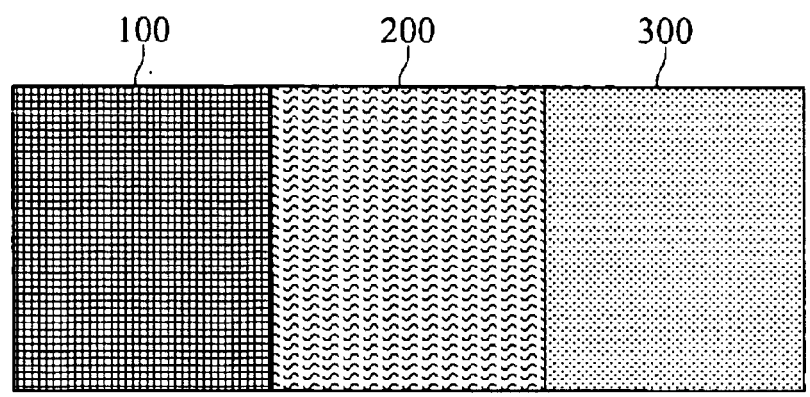
FIG. 1 is a schematic view of the structure in a preferred embodiment of the invention.
Figure 1A:
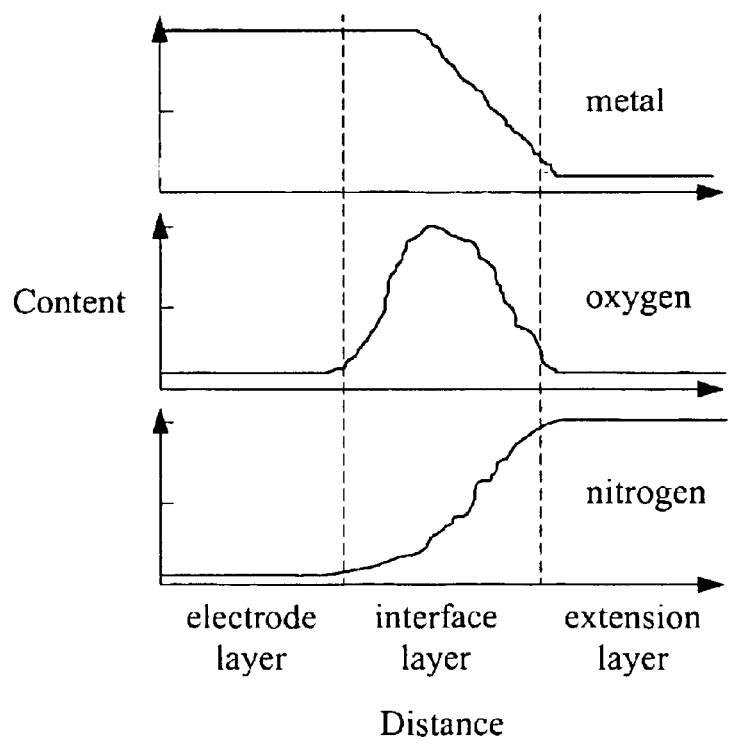
FIGS. 1A to 1F show content distributions of the main ingredients in an invention.
Figure 1B:
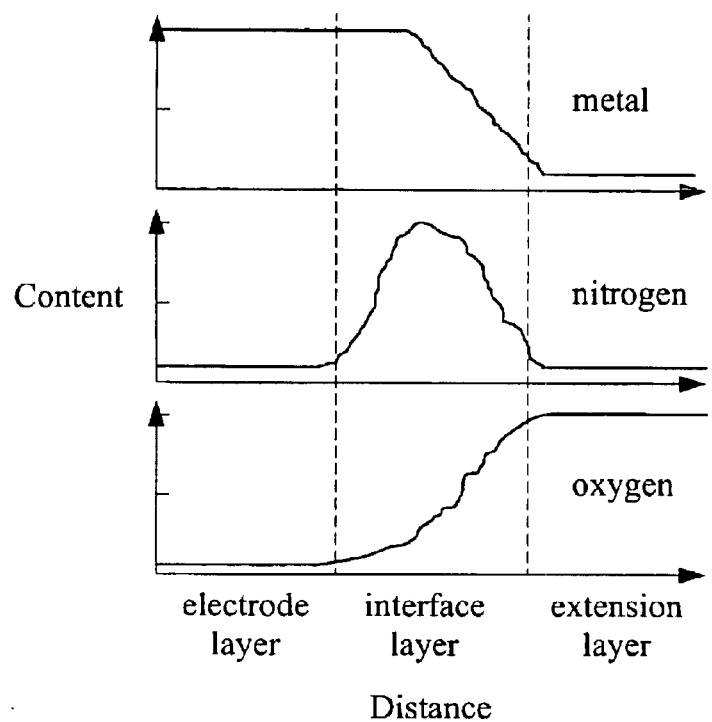
Figure 1C:
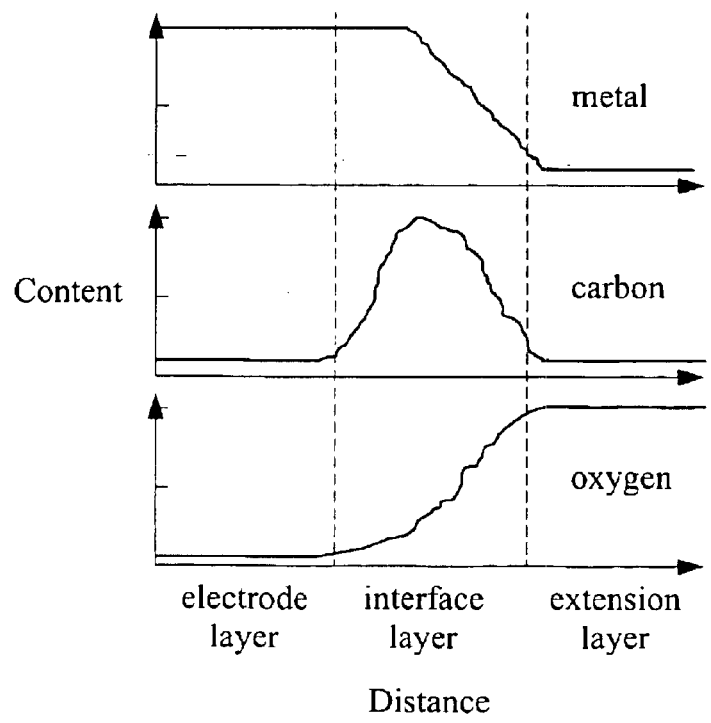
Figure 1D:
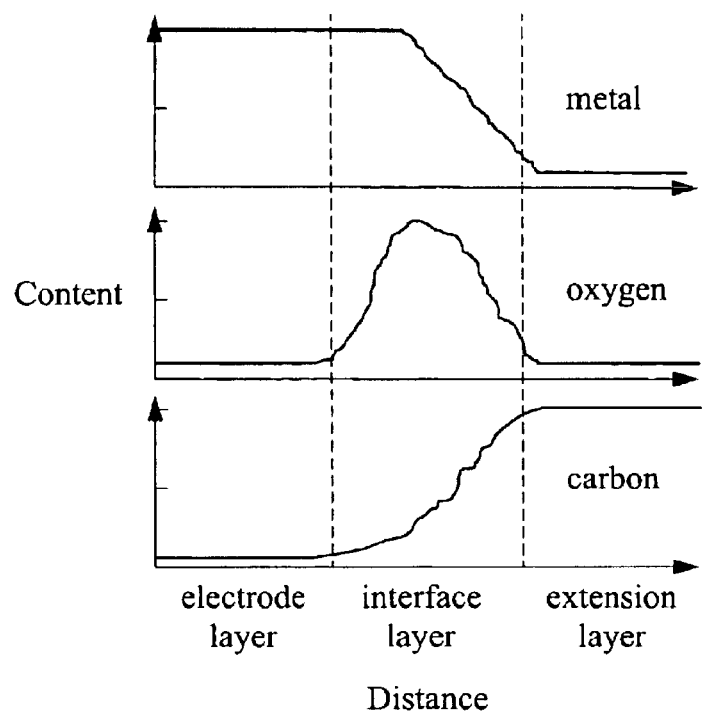
Figure 1E:
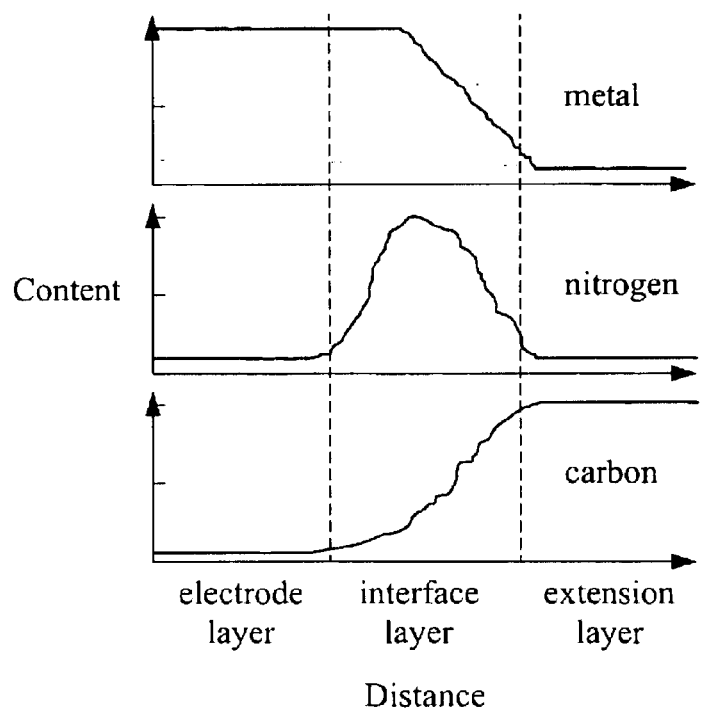
Figure 1F:
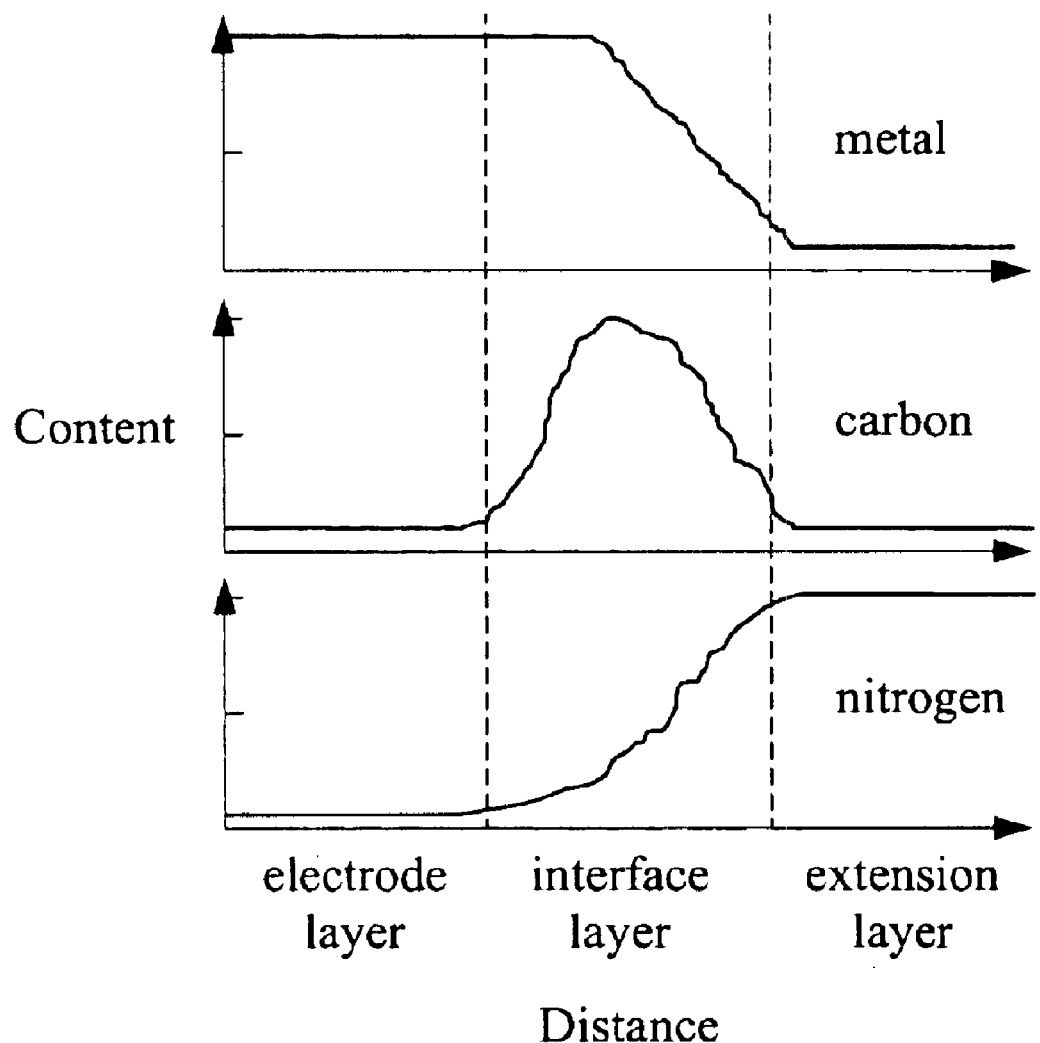

With reference to FIG. 1, the self-organized nanometer interface structure in a preferred embodiment of the invention consists of an electrode layer 100, an interface layer 200, and an extensive layer 300.

The electrode layer 100 is the part for connecting a diode and relevant devices. It is mainly made of pure metals or alloys.

The interface layer 200 is formed on one side of the electrode layer 100 as the polarity change layer of semiconductor materials or storage tunneling layer of carriers. It is mainly made of metal oxides, metal nitrides, metal carbonates or their mixtures.

The extensive layer 300 is formed on the other side of the interface layer 200 for connections in a periodic structure or another end electrode. It is also mainly made of metal oxides, metal nitrides, metal carbonates or their mixtures.

The manufacturing method is to employ the usual sputtering apparatus to control the gas ratio in the sputtering chamber. The chemical dynamics difference among the reactants differentiates to induce self organization, forming a special nanometer interface structure.

The manufacturing conditions have the following regularities:

(1) The main content of the electrode layer is a metal element.

(2) The metal content in the interface layer decreases monotonically with the distance from the electrode layer. The ingredient A has a bell-shape distribution as a function of the distance from the electrode layer. The content of the ingredient B increases monotonically with the distance from the electrode layer. Here and in the following, the ingredients A and B refer to any two of the carbon, oxygen, and nitrogen atoms.

(3) The extensive layer contains a small amount of metal and the ingredient A, but a large amount of the ingredient B.

Figure 2:
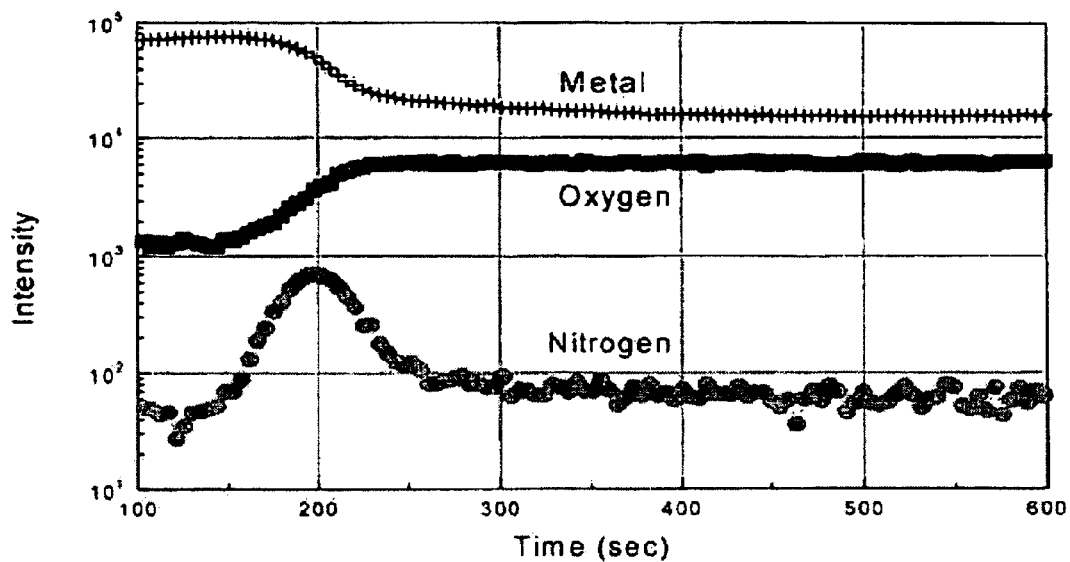
FIG. 2 shows a measurement result of the distribution of the main ingredients in an actual experiment according to the preferred embodiment.

The content distributions of the main ingredients are shown in FIGS. 1A to 1F. The above-mentioned regularities can be more easily seen using diagram, as shown in FIG. 2.

Figure 3:
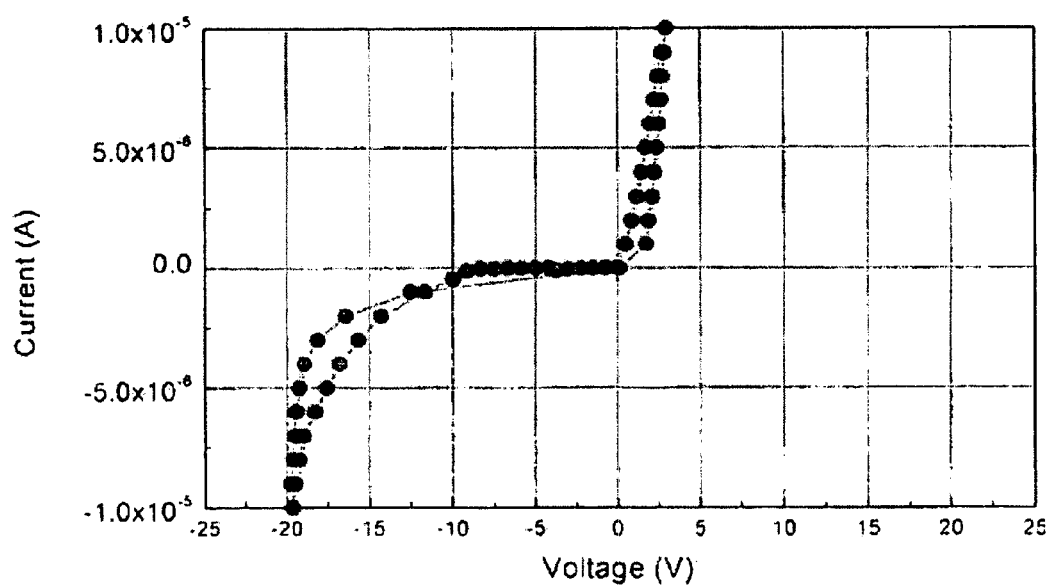
FIG. 3 shows a measurement result of an electric property experiment of the preferred embodiment.
Figure 4:
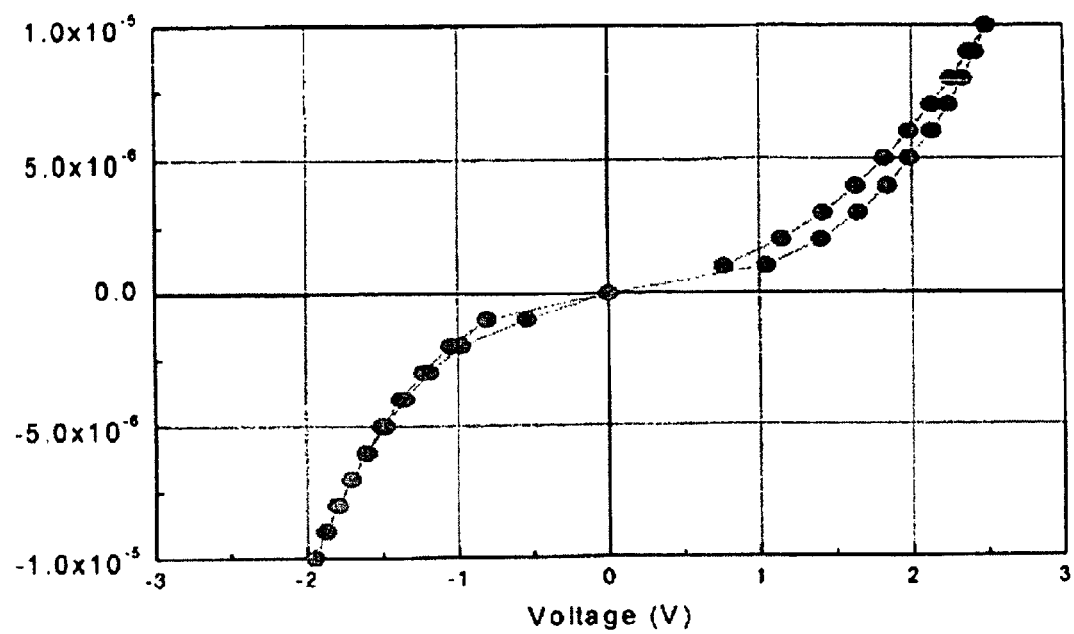
FIG. 4 shows a measurement result of an electric property experiment of another embodiment, where it is shown that the rectifying effect is not explicit in a specific potential variation range if the manufacturing conditions are not appropriately controlled.
Figure 5:
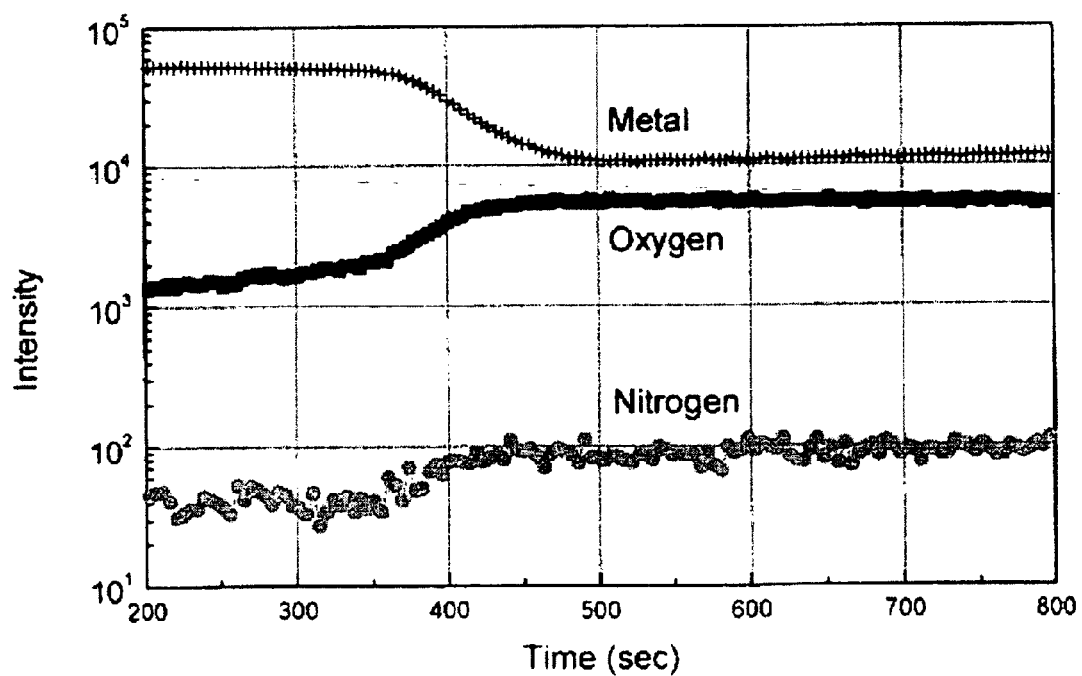
FIG. 5 shows a measurement result of the distribution of the main ingredients in another actual experiment, showing that the ingredient A (nitrogen here) in the interface layer does not has a bell-shape distribution when the manufacturing conditions are not appropriately controlled.

When the content distributions in all layers of the disclosed nanometer interface structure have the above-mentioned regularities, we find that it has the rectifying effect in a specific potential variation range. Therefore, it has the property of a diode. The electric property measurement result in an actual experiment is given in FIG. 3. When the manufacturing conditions are not properly controlled, the ingredient A (nitrogen here) in the interface layer cannot have the desired bell-shape (see FIG. 5). Correspondingly, it does not have the rectifying effect in a potential variation range (FIG. 4).

In comparison with the current large-volume III-V family doped impurity required in diode manufacturing technique, the invention provides a different means that only employs the normal sputtering apparatus. Various organic or inorganic materials can be used. During the reactive sputtering process, the chemical dynamics difference can generate a nanometer interface structure with the diode properties. It can be widely used in the fabrication of diodes, transistors, light-emitting devices, and sonic devices. The invention has many advantages in practice. For example, no expensive single crystal substrate is required; there is a wide variety of material selections; the manufacturing process is more compatible; the control is easy; and the cost is lower.

Certain variations would be apparent to those skilled in the art, which variations are considered within the spirit and scope of the claimed invention.

What is claimed is:

1. A self-organized nanometer interface structure, comprising:
   an electrode layer, whose content is mainly a metal element;
   an interface layer, which is adjacent to the electrode layer and contains the metal, an ingredient A and an ingredient B; wherein the content of the metal has a distribution profile which decreases monotonically with the distance from the electrode layer, the content of the ingredient A has a bell-shape distribution profile from the electrode layer, and the content of the ingredient B increases monotonically with the distance from the electrode layer; and
   an extensive layer, which is adjacent to the other side of the interface layer and contains the metal, the ingredient A and the ingredient B; wherein the concentrations of the metal and the ingredient A is low while that of the ingredient B is high.

2. The self-organized nanometer interface structure of claim 1, wherein the self-organized nanometer interface structure is constructed from ingredients selected from the group consisting of metals, metal oxides, metal nitrides, and metal carbonates.

3. The self-organized nanometer interface structure of claim 1, wherein the ingredient A is oxygen and the ingredient B is nitrogen with the following concentration behaviors:

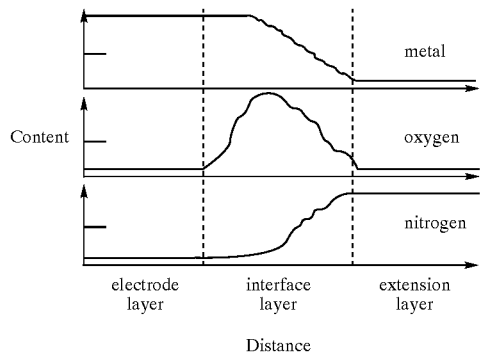

4. The self-organized nanometer interface structure of claim 1, wherein the ingredient A is nitrogen and the ingredient B is oxygen with the following concentration behaviors:

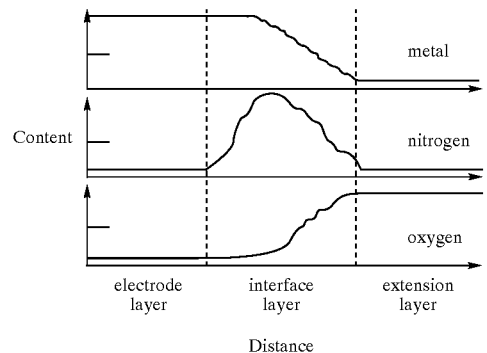

5. The self-organized nanometer interface structure of claim 1, wherein the ingredient A is carbon and the ingredient B is oxygen with the following concentration behaviors:

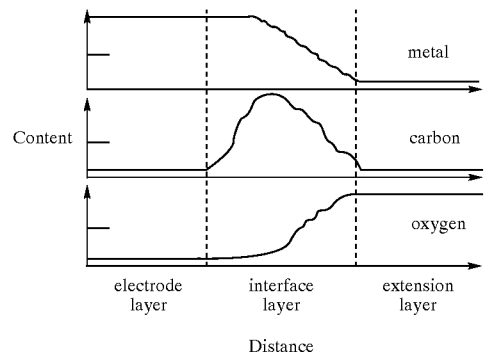

6. The self-organized nanometer interface structure of claim 1, wherein the ingredient A is oxygen and the ingredient B is carbon with the following concentration behaviors:

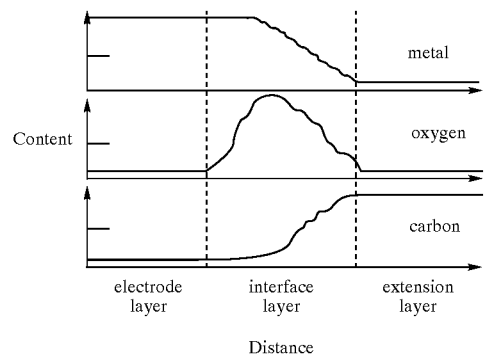

7. The self-organized nanometer interface structure of claim 1, wherein the ingredient A is nitrogen and the ingredient B is carbon with the following concentration behaviors:

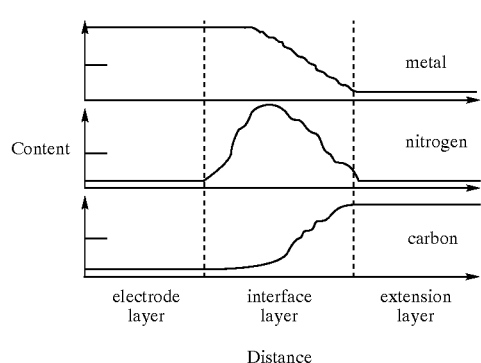

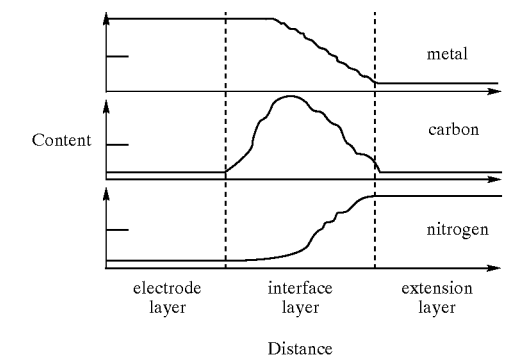

8. The self-organized nanometer interface structure of claim 1, wherein the ingredient A is carbon and the ingredient B is nitrogen with the following concentration behaviors:

9. The self-organized nanometer interface structure of claim 1 used as a primary junction structure in manufacturing diodes, transistors, memory devices, light-emitting devices, optical amplifiers, optical switches, optical adjusters, photo detectors, and sonic devices.

* * * * *